(12) United States Patent
Gibson

(10) Patent No.: US 11,623,194 B2
(45) Date of Patent: Apr. 11, 2023

(54) APPARATUS FOR THE MANUFACTURE OF SYNTHETIC DIAMONDS USING DIFFERENTIAL EXPANSION

(71) Applicant: GULL CORPORATION LTD, Stockton on Tees (GB)

(72) Inventor: Gary Gibson, Coxhoe (GB)

(73) Assignee: Gull Corporation Ltd, Stockton-on-Tees (GB)

( * ) Notice: Subject to any disclaimer, the term of this patent is extended or adjusted under 35 U.S.C. 154(b) by 0 days.

(21) Appl. No.: 16/998,309

(22) Filed: Aug. 20, 2020

(65) Prior Publication Data

US 2020/0376454 A1    Dec. 3, 2020

Related U.S. Application Data

(63) Continuation of application No. PCT/GB2020/051321, filed on Jun. 1, 2020.

(30) Foreign Application Priority Data

May 30, 2019  (GB) ..................................... 1907655

(51) Int. Cl.
*C30B 35/00* (2006.01)
*B01J 3/06* (2006.01)
(Continued)

(52) U.S. Cl.
CPC ................. *B01J 3/065* (2013.01); *B01J 3/04* (2013.01); *C01B 32/26* (2017.08); *C01B 32/36* (2017.08);
(Continued)

(58) Field of Classification Search
CPC .... C30B 1/00; C30B 1/02; C30B 1/04; C30B 1/06; C30B 1/12; C30B 29/00;
(Continued)

(56) References Cited

U.S. PATENT DOCUMENTS 3,567,896 A * 3/1971 Chang ........................ B01J 3/06
                                                                                    219/50
4,251,488 A    2/1981 Estanislao
(Continued)

FOREIGN PATENT DOCUMENTS

CN        105107431 A    12/2015

OTHER PUBLICATIONS

Y. Kawashima publication entitled "Diamond synthesis using a new type of high-pressure apparatus," Rev. Sci. Instrum., vol. 59, vol. 4, pp. 667-668 (1988). (Year: 1988).*
(Continued)

*Primary Examiner* — Kenneth A Bratland, Jr.
(74) *Attorney, Agent, or Firm* — Kinney & Lange, P.A.

(57) ABSTRACT

An apparatus for the manufacture of synthetic diamonds includes a pressure vessel having a chamber therein, and a body located in the chamber. The pressure vessel and the body are formed of materials having different coefficients of expansion. The coefficient of expansion of the body is greater than the coefficient of expansion of the pressure vessel. The pressure vessel is formed from a material having a melting point in excess of 1327° C. and capable of withstanding a pressure of at least 4.4 Gpa at a temperature of at least 1327° C. The chamber is configured to receive the body, and a carbon source, the apparatus further comprising a heating means configured to heat at least the body to a temperature at least of 1327° C. The coefficient of expansion of the body is selected such that upon heating thereof to at least 1327° C. the pressure exerted on the carbon source is at least 4.4 Gpa.

27 Claims, 20 Drawing Sheets

(51) Int. Cl.
  *C01B 32/26* (2017.01)
  *C01B 32/36* (2017.01)
  *B01J 3/04* (2006.01)
  *C30B 31/10* (2006.01)
(52) U.S. Cl.
  CPC ............ *C30B 31/10* (2013.01); *C30B 35/002* (2013.01); *B01J 2203/0625* (2013.01); *B01J 2203/0655* (2013.01)
(58) Field of Classification Search
  CPC ......... C30B 29/02; C30B 29/04; C30B 31/00; C30B 31/10; C30B 35/00; C30B 35/002; B01J 3/04; B01J 3/065; B01J 2203/0625; B01J 2203/0655; C01B 32/26; C01B 32/36
  USPC ........... 117/4, 6–7, 9–10, 200, 204, 928–929
  See application file for complete search history.

(56) References Cited

U.S. PATENT DOCUMENTS 4,632,817 A * 12/1986 Yazu ...................... B01J 3/062
 117/41
2001/0001385 A1* 5/2001 Nakamura ............ H01L 29/167
 117/84

OTHER PUBLICATIONS

Website from AZO Materials on Tungsten Carbide accessed on Jan. 5, 2022, at https://www.azom.com/properties.aspx?ArticleID=1203. (Year: 2022).*

Website from AZO Materials on Zirconia accessed on Jan. 5, 2022, at https://www.azom.com/properties.aspx?ArticleID=133. (Year: 2022).*

* cited by examiner

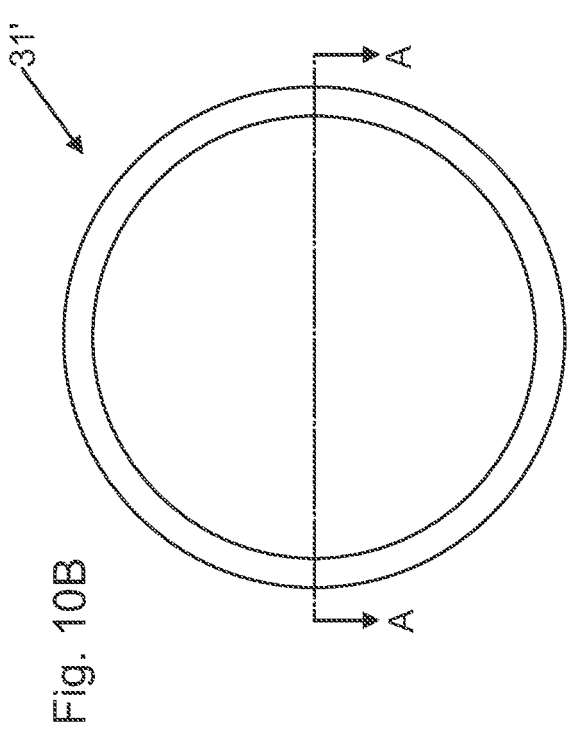
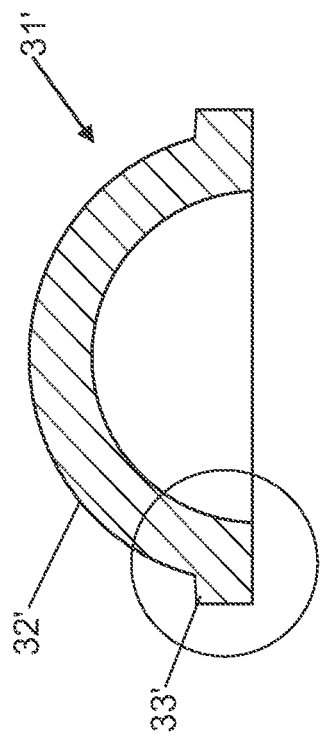
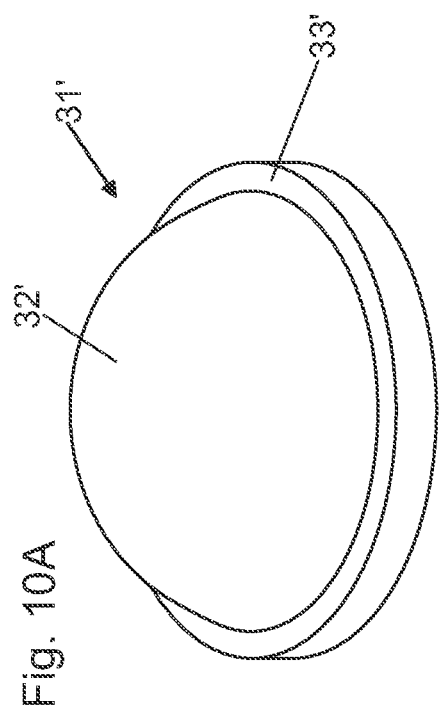
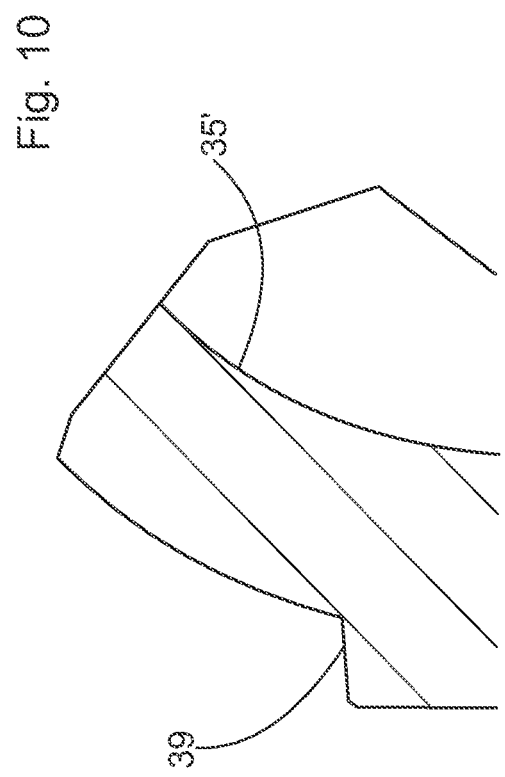
Fig. 10A
Fig. 10B
Fig. 10C
Fig. 10D
Fig. 10

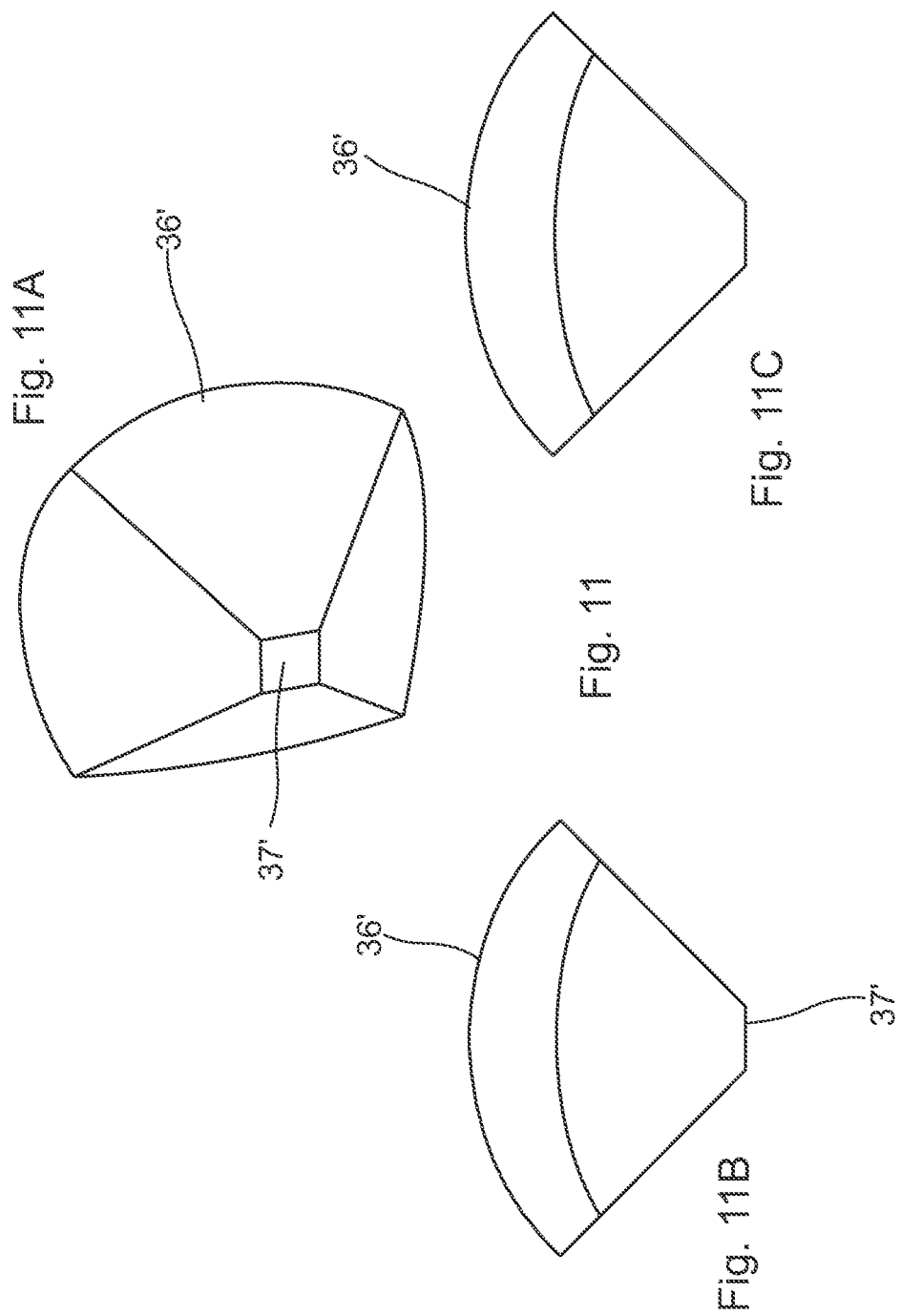

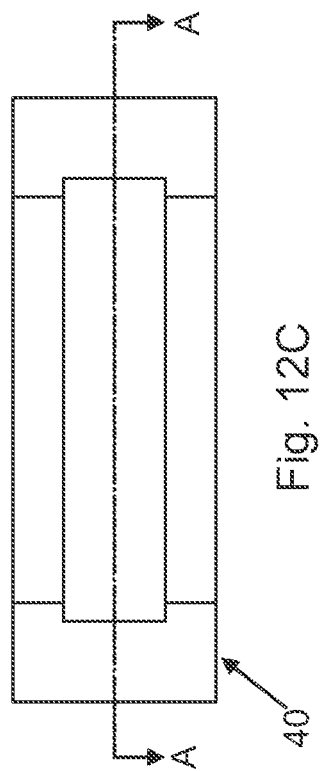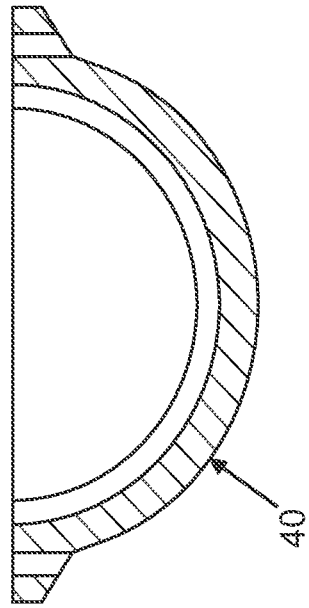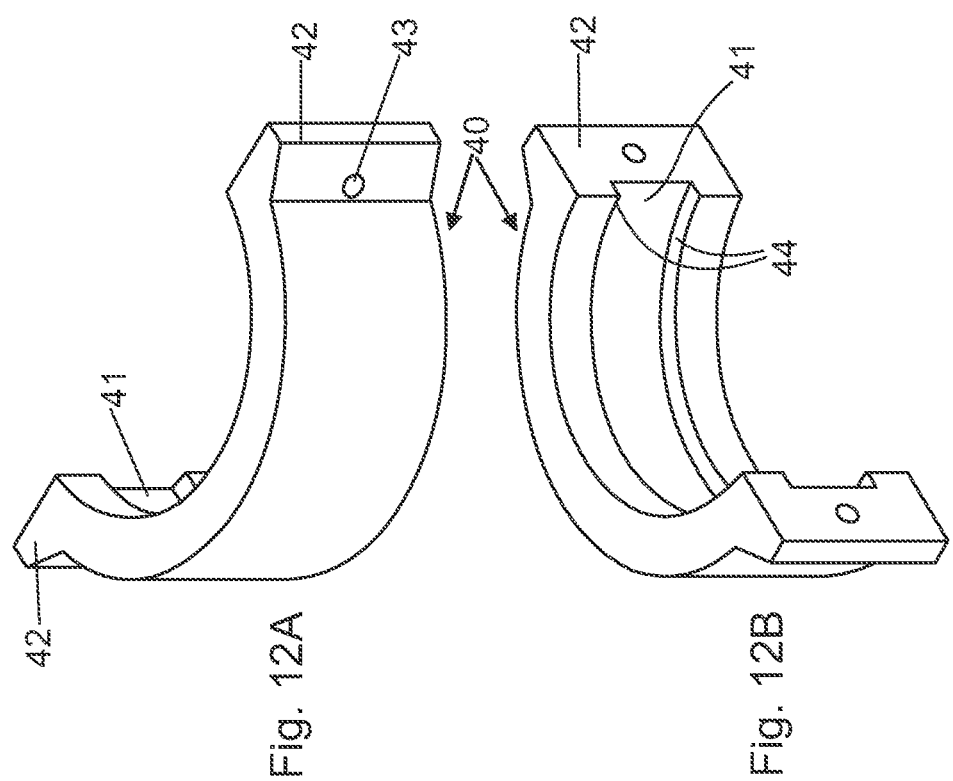

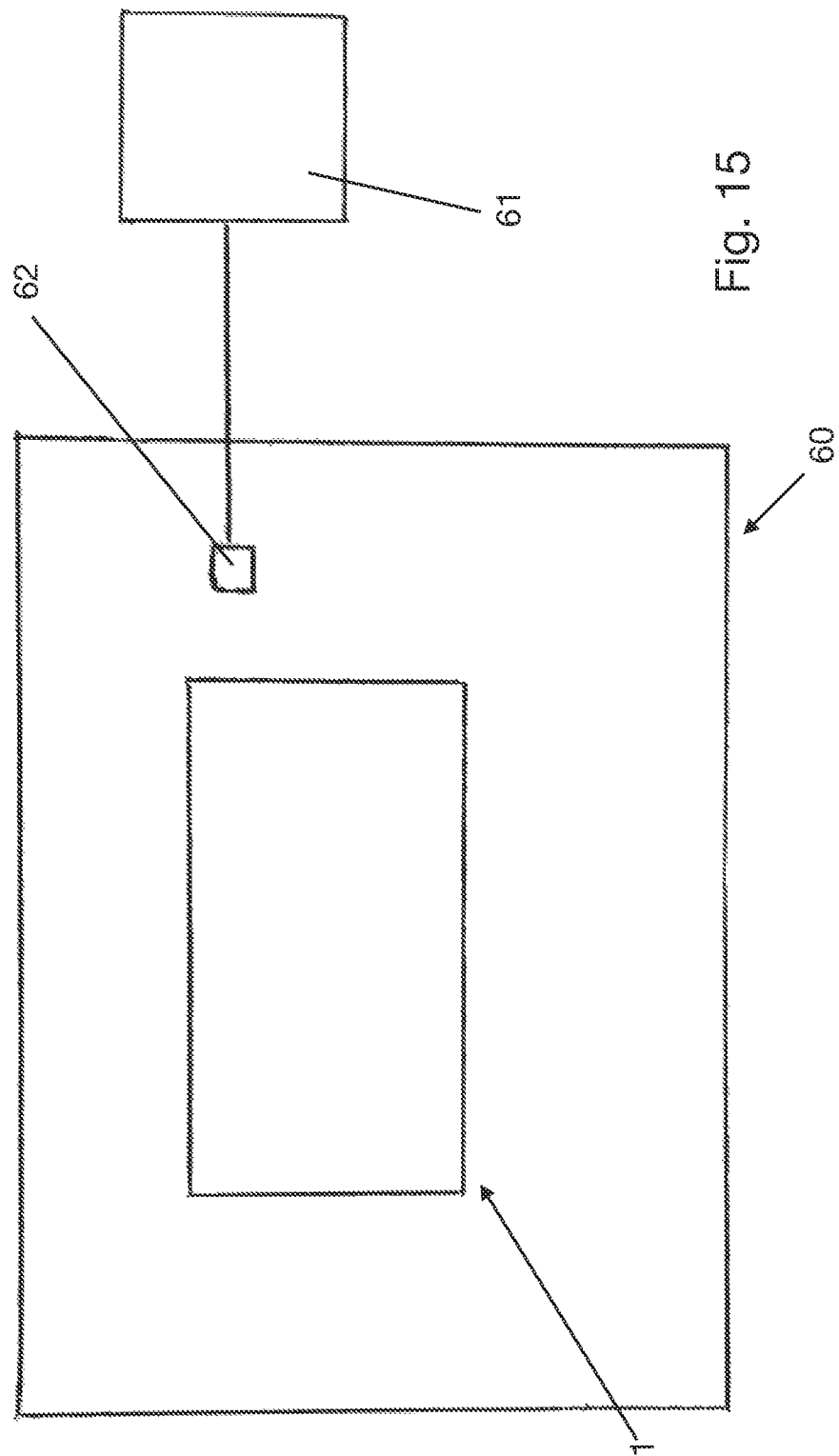

APPARATUS FOR THE MANUFACTURE OF SYNTHETIC DIAMONDS USING DIFFERENTIAL EXPANSION

CROSS-REFERENCE TO RELATED APPLICATION(S)

This application is a continuation of PCT Application No. PCT/GB2020/051321, filed on Jun. 1, 2020, entitled "Apparatus and Methods for the Manufacture of Synthetic Diamonds", by Gary Gibson, which claims the benefit of European Application No. 1907655.3, filed on May 30, 2019, both of which are incorporated herein by reference in their entireties.

TECHNICAL FIELD

The present disclosure relates to apparatus and methods for the manufacture of synthetic diamonds and in particular to methods using high pressure and high temperature to grow synthetic diamonds.

BACKGROUND

Certain conditions are required for the growing synthetic diamonds. The chart of FIG. 18 illustrates the temperature and pressure conditions in which synthetic diamonds may be grown from a carbon source. As can be seen from FIG. 18, when using a catalyst with high pressure and high temperature conditions a minimum pressure of 4.4 GPa with a minimum temperature of 1327° C. are necessary for the formation of synthetic diamonds.

Synthetic diamonds are manufactured by two techniques. One uses conditions of high pressure and high temperature and is known as the high pressure high temperature (HPHT) method. The other uses chemical vapor deposition and is known as the CVD method.

The present disclosure is concerned with the HPHT method. Commercial apparatus utilized in the production of synthetic diamonds following the HPHT method use presses sometimes weighing hundreds of tons to produce a pressure of 5 GPa at 1500° C.

There are three main press designs used to implement the HPHT method, those being: the belt press, the cubic press and the split-sphere (BARS) press. Diamond seeds are placed at the bottom of the press. The internal part of press is heated above 1400 C and may melt the solvent metal. This catalytic metal dissolves a high purity carbon source, which is then transported via a thermal gradient to the small diamond seeds and precipitates, forming a large synthetic diamond. In addition, if diamond seeds are not used and/or a thermal gradient not used then diamond will form as a powder or grit, i.e. the diamond forms in a much smaller physical form.

The belt press comprises upper and lower anvils which supply the pressure load to a cylindrical inner cell. This internal pressure is confined radially by a belt of pre-stressed steel bands or hydraulic pressure. The anvils also serve as electrodes providing electric current to the compressed cell to heat the material contained in the cell.

The second type of press design is the cubic press. A cubic press has six anvils providing pressure simultaneously onto all faces of a cube-shaped or four anvils providing pressure simultaneously on to a tetrahedron-shaped volume. A cubic press is typically smaller than a belt press and can more rapidly achieve the pressure and temperature necessary to create synthetic diamonds.

The third press design used in the HPHT method is known as the BARS apparatus, illustrated in FIG. 17. It is claimed to be the most compact, efficient, and economical of all the diamond-producing presses. A BARS device has at its center a ceramic cylindrical "synthesis capsule" of about 2 $cm^3$ in size. A cell is placed into a cube of pressure-transmitting material, such as pyrophyllite ceramics, which is pressed by inner anvils made from ceramic carbide (e.g., tungsten carbide or VK10 hard alloy). The outer octahedral cavity is pressed by 8 steel outer anvils. The whole assembly is then locked in a disc-type barrel with a diameter about 1 meter. The barrel is filled with oil, which pressurizes upon heating, and the oil pressure is transferred to the central cell. The synthesis capsule is heated up by a coaxial graphite heater and the temperature is measured with a thermocouple.

Each of the above-mentioned types of apparatus requires complex arrangements for generating the pressure necessary to reach the threshold at which synthetic diamonds from.

It would be desirable to provide a simpler and less costly apparatus for manufacturing synthetic diamonds.

The inventor has conceived that the required pressure may be generated internally within a structure rather than by applying external pressure, which is the mode of pressure generation and application of the prior art different types of apparatus described above. For example, the BARS apparatus (illustrated in FIG. 17) relies on the expansion of an oil jacket to exert pressure on the components of the apparatus within the jacket.

The concept of generating the required pressure for diamond formation within a structure by the use of materials which expand at a differential rate with temperature has been considered previously.

U.S. Pat. No. 4,251,488 describes an anvil having a recess therein for receiving diamond forming materials and a piston to compress the diamond forming materials. The anvil is connected to an end plate by connecting threaded rods. The piston is attached to an expandable member which is attached to the end plate and aligned with the longitudinal axis of the recess. As the expandable member is heated, it expands more than the other components of the apparatus, thereby causing the piston to compress the diamond forming materials contained in the recess. However, the materials from which the apparatus is formed are in no way capable of withstanding the temperatures and pressures required for diamond formation. The apparatus would fail long before any diamond formation would occur.

CN105107431 describes a metal alloy block with heating elements therein. An element that has a greater coefficient of expansion is contained within the alloy block so that upon heating high pressure is generated within the alloy block.

U.S. Pat. No. 3,567,896 is not related to the formation of diamonds, but does described an apparatus for hot-pressing compactible materials by means of heating blocks of graphite that expand anisotripically within a graphite chamber that expands isotropically on heating. Whilst describing and apparatus that is capable of compressing a material upon heating of the apparatus, the apparatus described in U.S. Pat. No. 3,567,896 would not be suitable for the formation of synthetic diamonds.

The temperatures and pressures required for diamond formation are very high. The apparatus of the prior art that utilize differential expansion upon heating to generate pressure that are known from the art are not suitable for diamond formation.

The present disclosure seeks to provide an apparatus for use in the manufacture of synthetic diamonds by the HPHT method in which pressure is generated internally within a structure by virtue of heating the structure. Such an apparatus would not require the complex pressure generating arrangements presently used in the formation of synthetic diamonds.

SUMMARY

According to the present disclosure there is provided an apparatus for the manufacture of synthetic diamonds comprising a pressure vessel having a chamber therein, and a body located in the chamber, wherein the pressure vessel and the body are formed of materials having different coefficients of expansion, the coefficient of expansion of the body being greater than the coefficient of expansion of the pressure vessel, wherein the pressure vessel is formed from a material having a melting point in excess of 1327° C. and capable of withstanding a pressure of at least 4.4 GPa at temperatures of at least 1327° C., and wherein the chamber is configured to receive the body, and a carbon source, the apparatus further comprising a heating means configured to heat at least the body to a temperature at least of 1327° C. and wherein the coefficient of expansion of the body is selected such that upon heating thereof to at least 1327° C. the pressure exerted on the carbon source is at least 4.4 GPa.

Preferably, the pressure vessel is formed from a material having a melting point in excess of 1327° C. and capable of withstanding a pressure of at least 5 GPa at temperatures of at least 1327° C. The material from which the pressure vessel is formed may be capable of withstanding a pressure of at least 5 GPa at temperatures between 1327° C. and 1650° C. or in excess of 1650° C.

Preferably, the coefficient of expansion of the body is selected such that upon heating thereof to at least 1327° C. the pressure exerted on the carbon source is at least 5 GPa.

Preferably, the body has at least two surfaces and wherein expansion of at least one body surface is constrained by engagement of the at least one body surface with a surface of the chamber and another of the at least two body surfaces is not engaged with a surface of the chamber, and wherein the carbon source is situated between a surface of the chamber and the body surface that is not engaged by the surface of the chamber or the body has at least one body surface and the carbon source is situated around the body between the at least one body surface and the surface of the chamber.

Advantageously, the body includes a piston.

Preferably, the chamber is in the form of a cylinder and the piston is arranged in the cylinder.

The piston and cylinder may include cooperating portions of reduced area.

The apparatus may comprise a catalyst located in the chamber.

The catalyst may be comprised in the body.

The carbon source may be a part of the body.

It is preferred that the pressure vessel includes a plurality of inserts each of which forms at least one surface of the chamber, at least two housing members and fastening elements which fasten together the housing members, wherein the inserts sit inside the housing members and wherein the inserts, the housing members and the fastening elements resist pressure generated by expansion of the body upon heating thereof.

Advantageously, the inserts together form a sphere and the housing members each comprise a hemispherical shell shaped and dimensioned to receive the assembled inserts.

The inserts together may form a cylinder and at least one housing member shaped and dimensioned to receive the assembled inserts. The at least one housing member may be in the shape of a hoop, a ring or a tube.

The apparatus may be provided with at least one gasket situated between adjacent components of the apparatus, for example at least one gasket may be provided between adjacent inserts, or adjacent flanges, or between the end faces of inserts and an adjacent plate.

Gaskets may be formed of carbon, for example carbon sheets, carbon reinforced composites, carbon fiber reinforced composites, carbon-carbon (carbon reinforced carbon, carbon reinforced graphite, carbon fiber reinforced graphite, carbon fiber reinforced carbon) which may be in sheet form, or of soapstone, pyrophyllite, or other materials capable of withstanding the temperatures experienced by the apparatus and functioning as a gasket.

The provision of gaskets has been found to reduce the potential for fusion of adjacent components during their use for manufacturing synthetic diamonds.

The chamber may be spherical or a volume enclosed by a plurality of planar or curved surfaces.

The chamber may be cuboid in shape.

The housing members may each include a flange and the flanges may be aligned and fastened together with fastening means.

The fastening means may comprise bolts which pass through aligned holes in the flanges; or the fastening means may comprise a clamping ring including two clamp ring elements which are attached together and surround the flanges.

The clamping ring elements may include a recess and the flanges may sit in the recesses.

The flanges and the recess may comprise co-operating walls that are angled so that upon tightening of the clamp the flanges are forced together.

Preferably, the material from which the body is formed is selected from the group comprising: W, Nb, Mo, Ta, V, Ru, MoSi2, Rh, Fe, TZM.

Advantageously, the material from which the chamber is formed is selected from the group comprising: W, Nb, Mo, Ta, Ru, MoSi2, Rh, a cermet, 3% Co doped tungsten carbide, Boron Carbide, Hafnium Carbide, Boron Nitride and diamond.

Preferably, the material from which the housing members are formed is selected from the group comprising: W; a cermet; tungsten carbide; doped tungsten carbides; 3% Co doped tungsten carbide; boron carbide; carbon reinforced composites; carbon-fiber reinforced composites, carbon-fiber reinforced carbon composites, carbon reinforced graphite, carbon fiber reinforced graphite and carbon-carbon.

Advantageously, the material from which the fastening means are formed is selected from the group comprising: W, Ta, Nb and carbon fiber reinforced composites.

At least one seed diamond may be located in the chamber.

The at least one seed diamond may be comprised in the body.

Advantageously, the heating means is adapted to create a temperature gradient across the chamber rising from one side of the chamber to the other.

Advantageously, the temperature gradient rises from the surface of the chamber farthest from the body where the catalyst is situated to the surface of the body.

Preferably, the heating means is a furnace and the pressure vessel is situated within a furnace.

Advantageously, the furnace is capable of heating the pressure vessel, the body and the carbon source to a temperature in the range of 1327 C to 4000 C.

The furnace may be provided with a temperature sensor and a controller, the temperature sensor providing a furnace temperature feedback to the controller.

According to another aspect of the present disclosure there is provided a method for the manufacture of synthetic diamonds comprising the steps of:

providing an apparatus according to the first aspect of the present disclosure;

raising the temperature of the pressure vessel to a selected temperature within the range of 1327 C and 4000 C for a period of between 120 minutes and 1 week and controlling the temperature during the period;

generating a pressure of at least 4.4 GPa (preferably 5 GPa) within the chamber for the period.

The pressure generated may be up to 20 GPa.

BRIEF DESCRIPTION OF THE DRAWINGS

In the Drawings, which illustrate the conditions for synthetic diamond formation, prior art HPHT apparatus and preferred embodiments of the present disclosure, and which are by way of example:

FIG. 10 is a set of four elevations of housing components of an eighth apparatus of the present disclosure;

FIG. 10A is a perspective view of a housing component of an eighth apparatus of the present invention;

FIG. 10B is a plan view of the housing component illustrated in FIG. 10A;

FIG. 10C is a cross-sectional elevation on axis A-A in FIG. 10B; and

FIG. 10D is an exploded view of the part of the housing component encircled in FIG. 10C;

FIG. 11 is a set of three elevations of anvil cell components of the eighth apparatus of the present disclosure;

FIG. 11A is a perspective view of an anvil cell component of the eighth apparatus of the present invention;

FIG. 11B is a side view of the cell component illustrated in FIG. 11A; and

FIG. 11C is a end view of the cell component illustrated in FIG. 11A;

FIG. 12A is a perspective view of a first of a pair of clamping components of the eighth apparatus of the present disclosure;

FIG. 12B is a persepective view of a second of a pair of clamping components of the eighth apparatus of the present disclosure;

FIG. 12C is a front view of the clamping components illustrated in FIG. 12A and 12B; and FIG. 12D is a cross-sectional elevation of the clamping components on the axis A-A in FIG. 12C;

FIG. 15 is a schematic illustration of the heating arrangement of the present disclosure;

DETAILED DESCRIPTION

Figure 1:
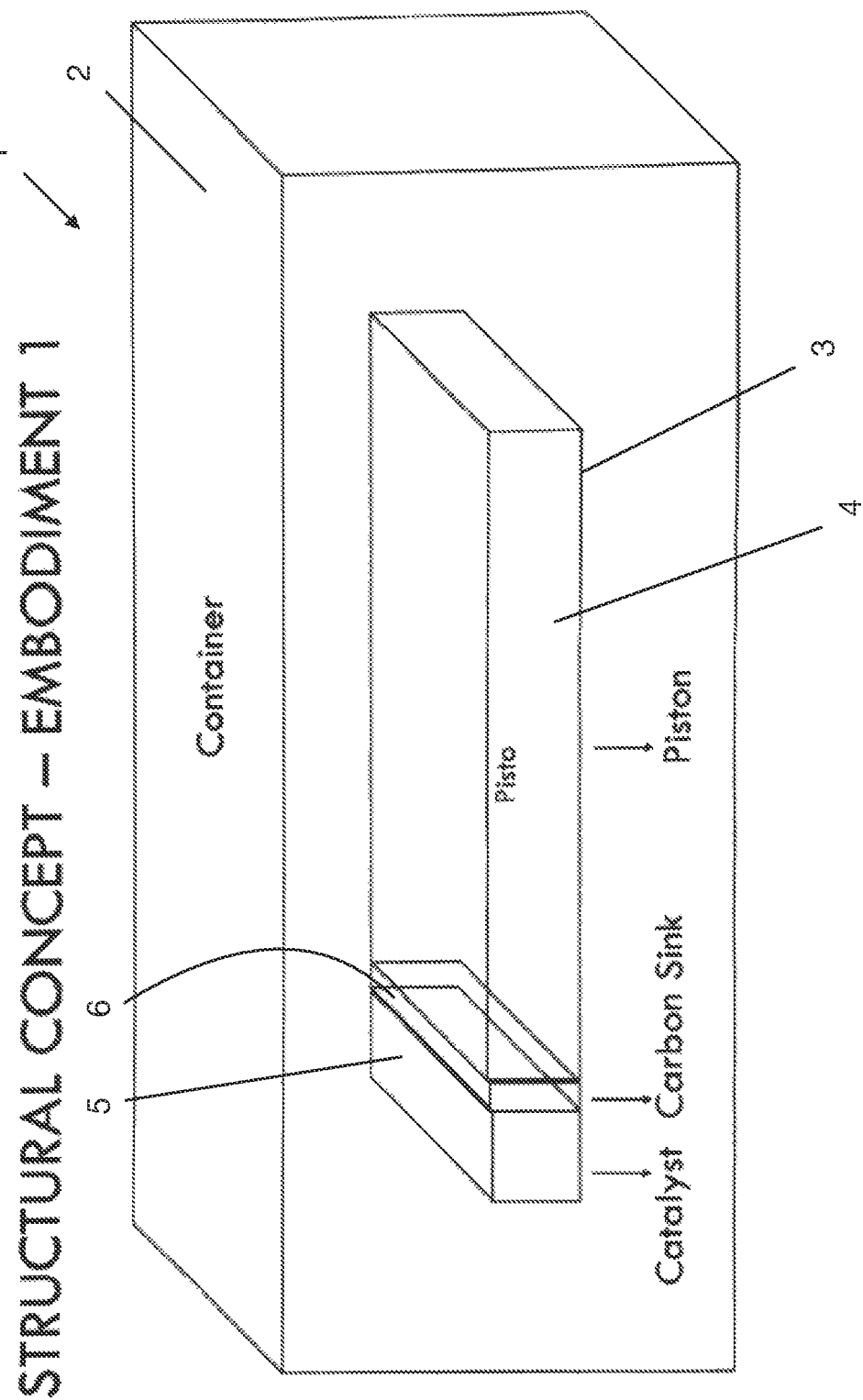
FIG. 1 is a schematic simplified representation of a first apparatus of the present disclosure.

FIG. 1 illustrates an apparatus according to the present disclosure in simplified form. The apparatus 1 comprises a container 2 having a cylinder 4 formed therein. A piston 3 is located in the cylinder 4, the piston resting against one end of the cylinder 3 and occupying most of the cylinder volume. A small part of the end of the cylinder 4 receives a catalyst and a carbon source 6, that is a supply of carbon. The carbon source 6 could be graphite for example. The remainder of the volume of cylinder 4 is occupied by a catalyst 5.

To form synthetic diamonds, the whole apparatus is heated to a temperature at which diamonds will form. The piston 4 and container 2 are made from different materials which have different coefficients of expansion when heated. The materials are selected so that when heated to the afore-mentioned temperature the piston expands proportionately more than the cylinder and sufficient to exert the required pressure of at least 4.4 GPa (typically 5 GPa or greater) on the carbon source 6 and catalyst 5 contained within the cylinder 3.

By maintaining the temperature of the apparatus 1 the pressure exerted on the carbon source 6 and catalyst 5 is maintained.

Figure 16:
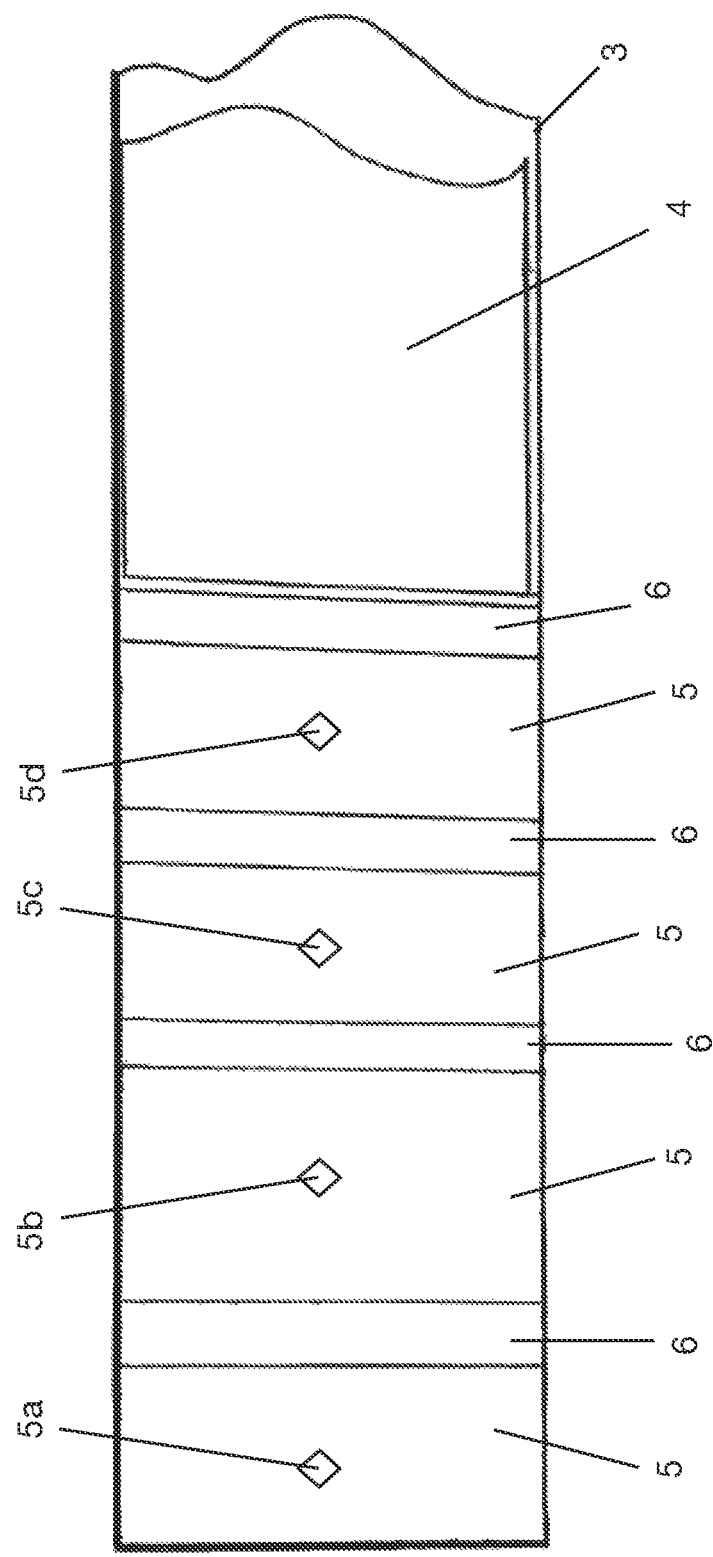
FIG. 16 illustrates an arrangement comprising a stack of seed diamonds.
Figure 17:
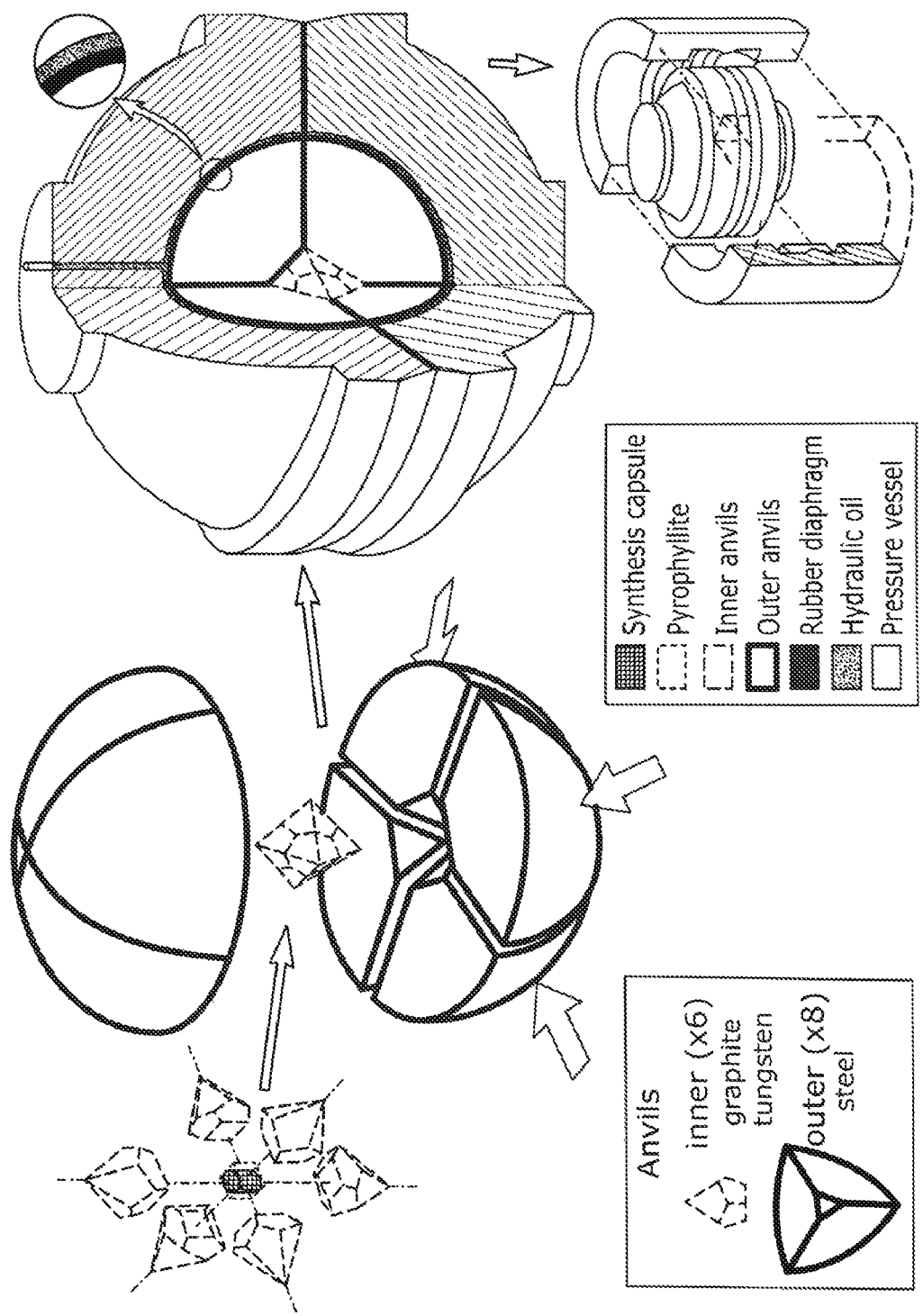
FIG. 17 is a schematic representation of a BARS apparatus of the prior art.
Figure 18:
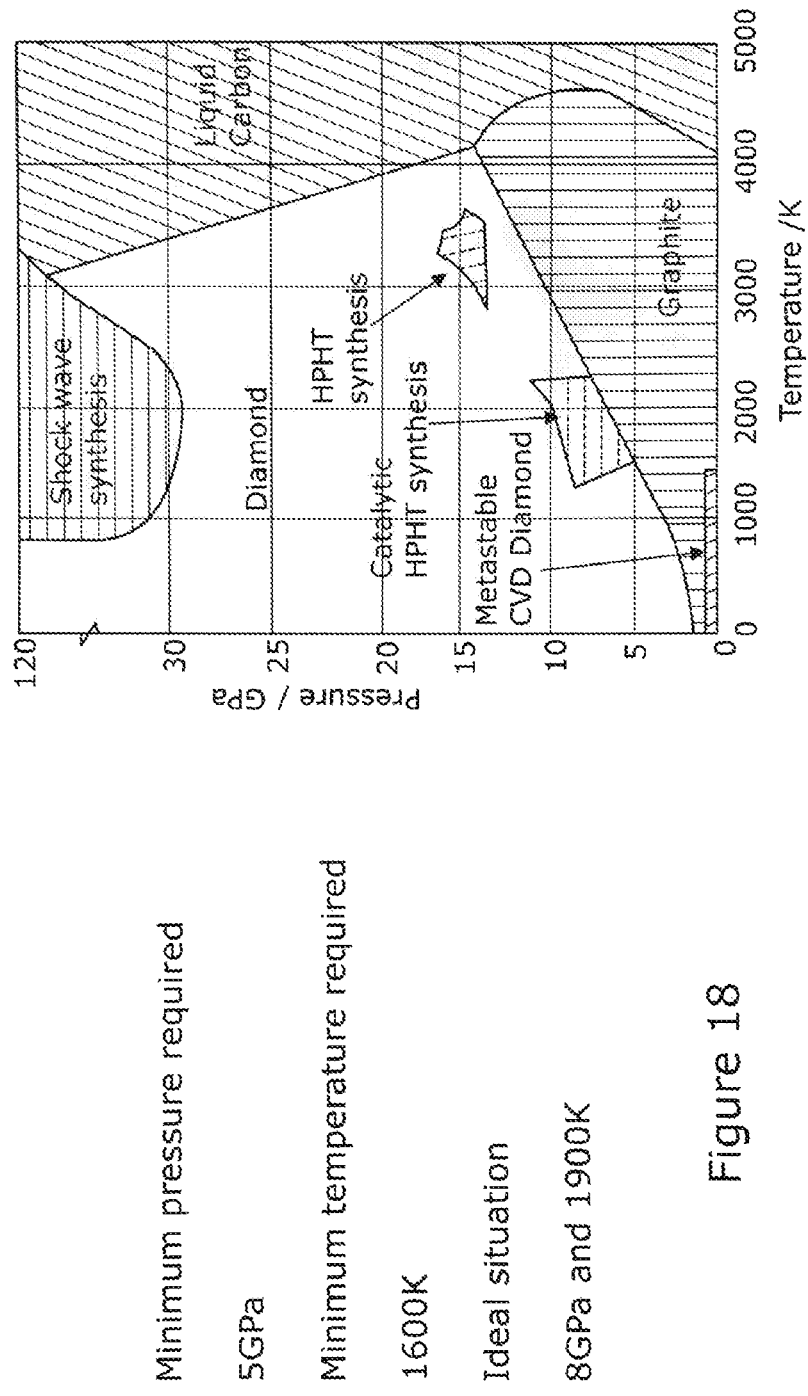
FIG. 18 is a chart illustrating the conditions under which synthetic diamonds may be formed.

FIG. 16 illustrates a stack of catalysts 5, carbon sources 6 and seed diamonds 5a-5d.

Figure 2:
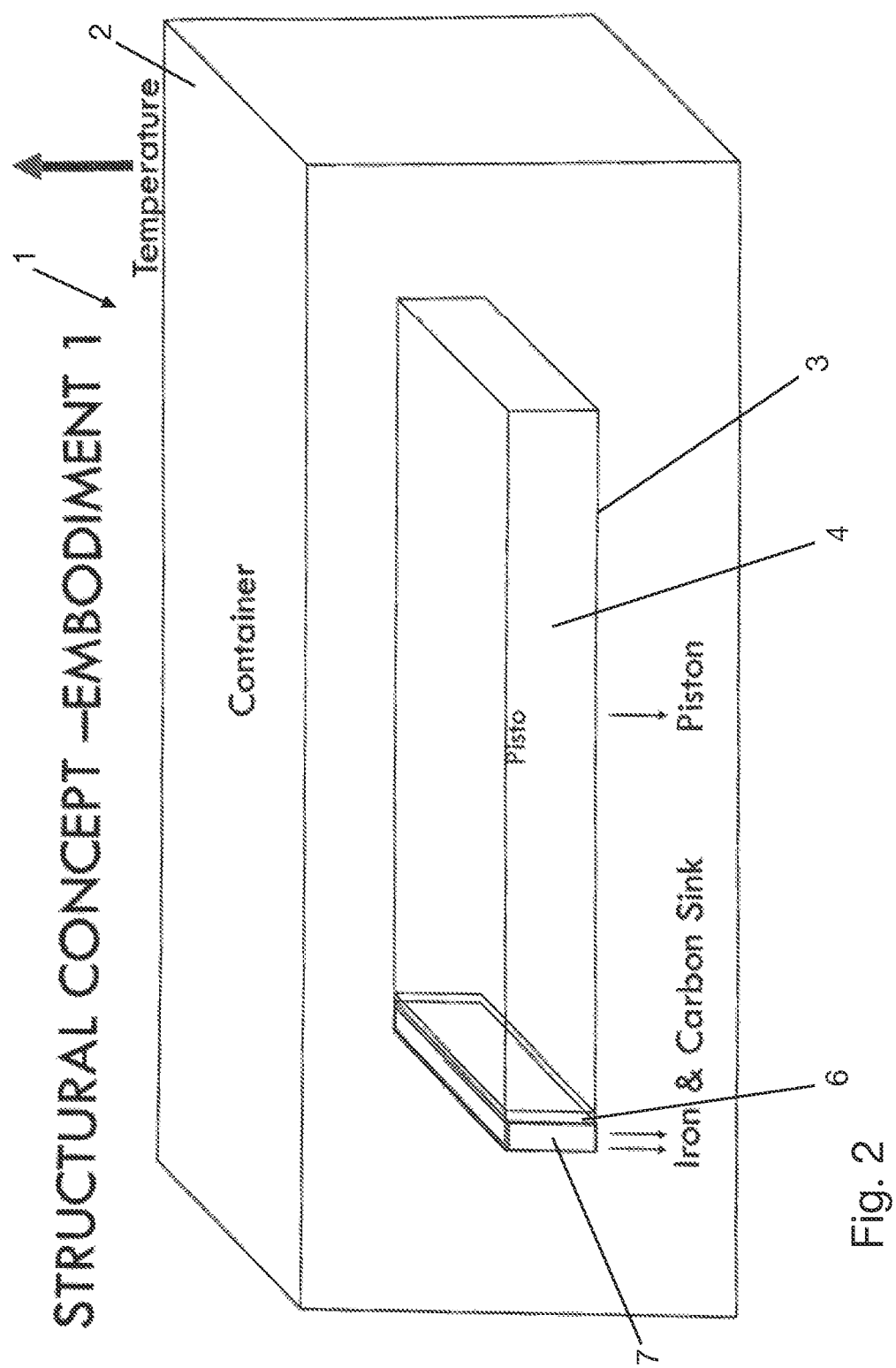
FIG. 2 is a simplified schematic representation of a variation of the first apparatus of the present disclosure.

The embodiment of the apparatus illustrated in FIG. 2 is similar to that shown in FIG. 1. The difference lies in presence of a body of iron 7 in the cylinder 3 in FIG. 2 instead of the catalyst of the embodiment illustrated in FIG. 1.

In the embodiments illustrated in FIGS. 1 and 2, the pressure exerted on the catalyst or iron and carbon source depends on the temperature to which the apparatus 1 is raised, the materials selected for the piston 4 and cylinder 3 and the length of the piston (a longer piston will expand more than a shorter piston for the same temperature rise where the pistons are otherwise the same).

Figure 3:
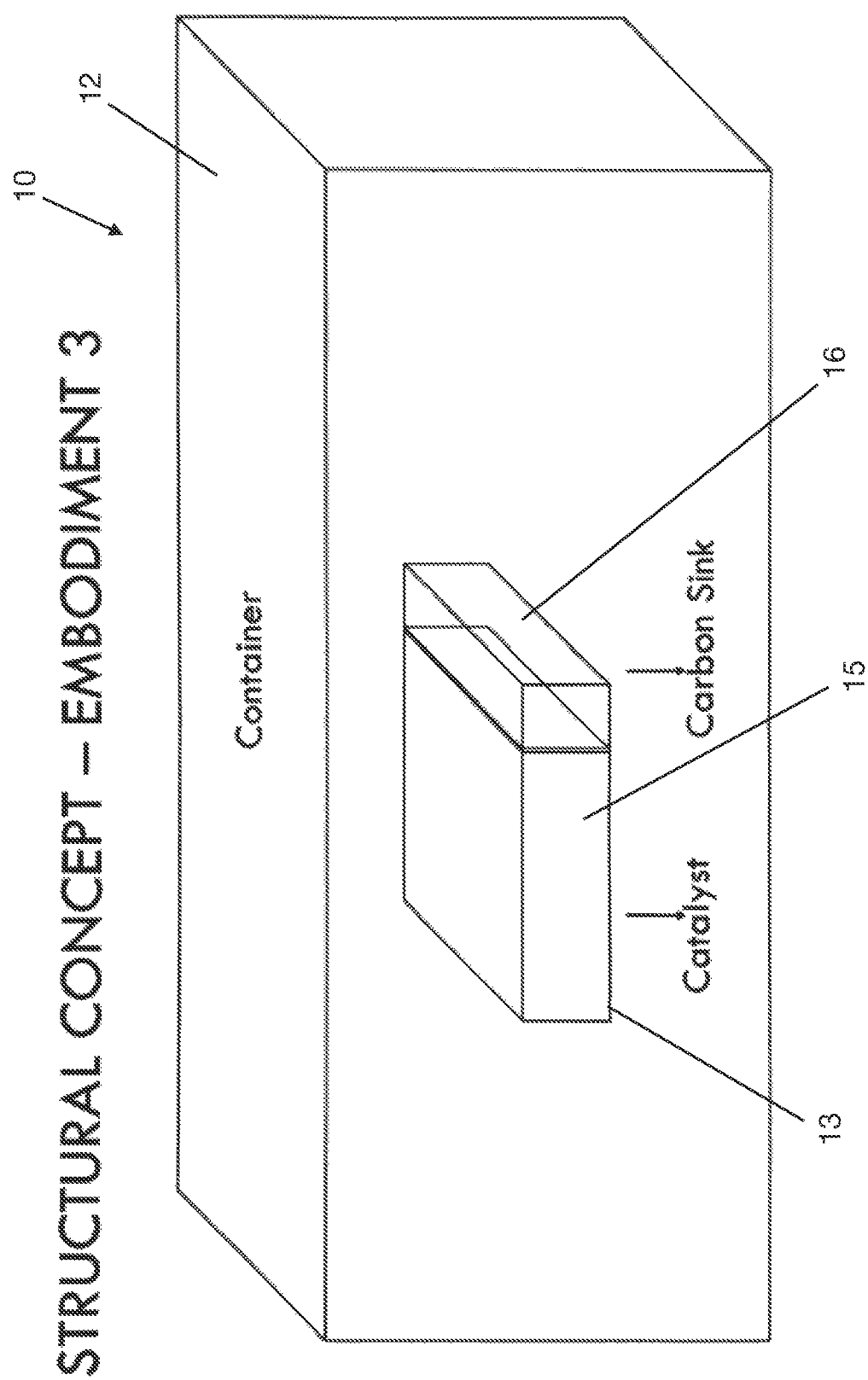
FIG. 3 is a simplified schematic representation of a second apparatus of the present disclosure.

The embodiment illustrated in FIG. 3 has a different configuration of cylinder 3', 3" and piston 4', 4". The piston 4' has a projecting portion 4" at one end. The cylinder 3' includes a correspondingly shaped portion 3" for receiving the projecting portion 4" of the piston 4'. The catalyst 5 and carbon source 6 are situated in the portion 3" of the cylinder 3'. The force generated upon expansion of the piston 3', 3" is therefore exerted over a smaller area than is the case with the embodiments illustrated in FIGS. 1 and 2 and hence a greater pressure is generated in comparison with the embodiments of FIGS. 1 and 2 for the same temperature rise, assuming that the apparatus 1 and 1' are otherwise the same.

Figure 4:
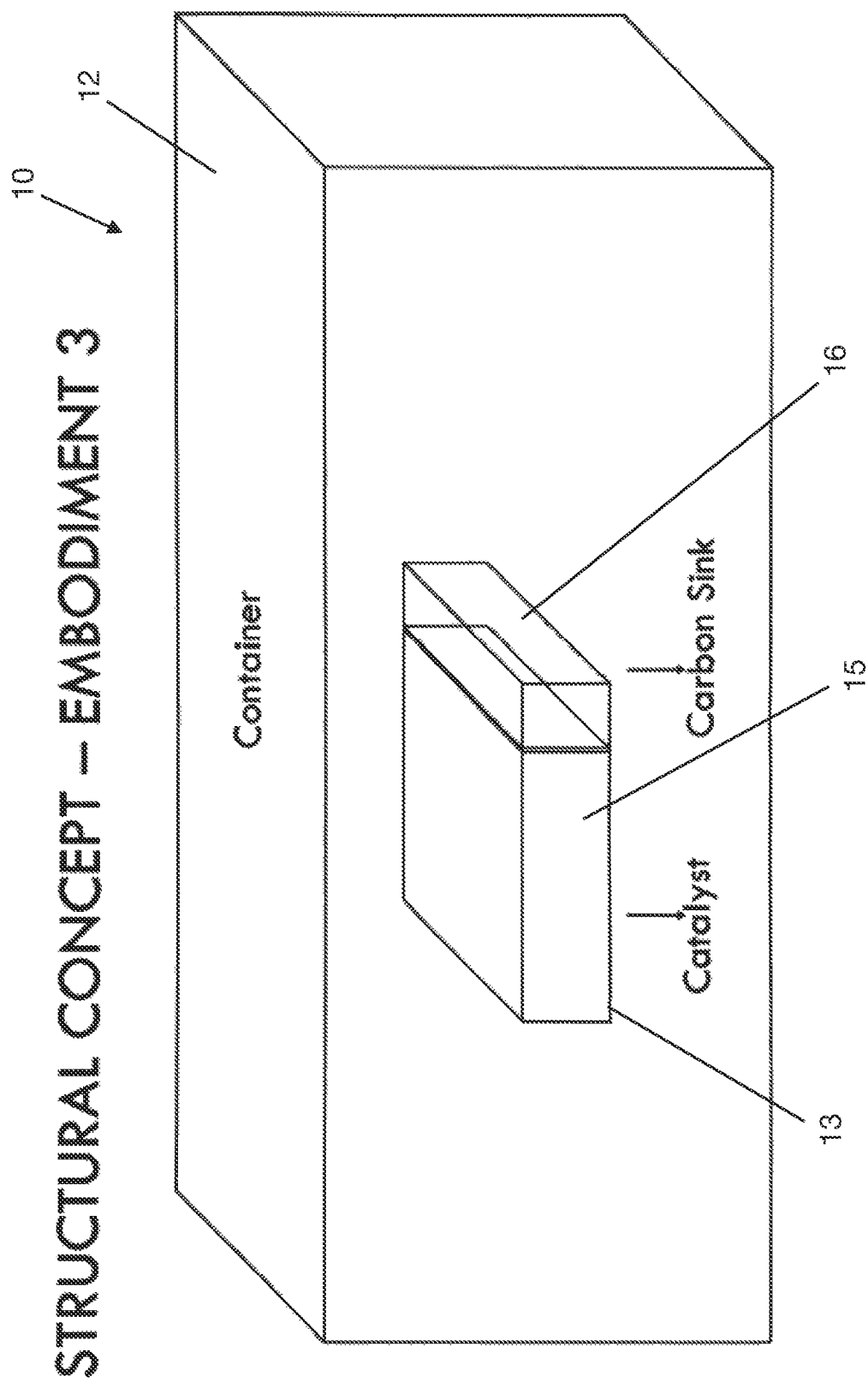
FIG. 4 is a simplified schematic representation of a third apparatus of the present disclosure.

FIG. 4 illustrates an apparatus 10 comprising a container 12 having a cylinder 13 formed therein. A catalyst 15 and carbon source 16 are situated in the cylinder 13. In this embodiment the catalyst has a different coefficient of expansion to the container 12. The catalyst 15 fulfils the role of the piston in the earlier embodiments, expanding more than the container 12 when the two are heated.

Figure 5:
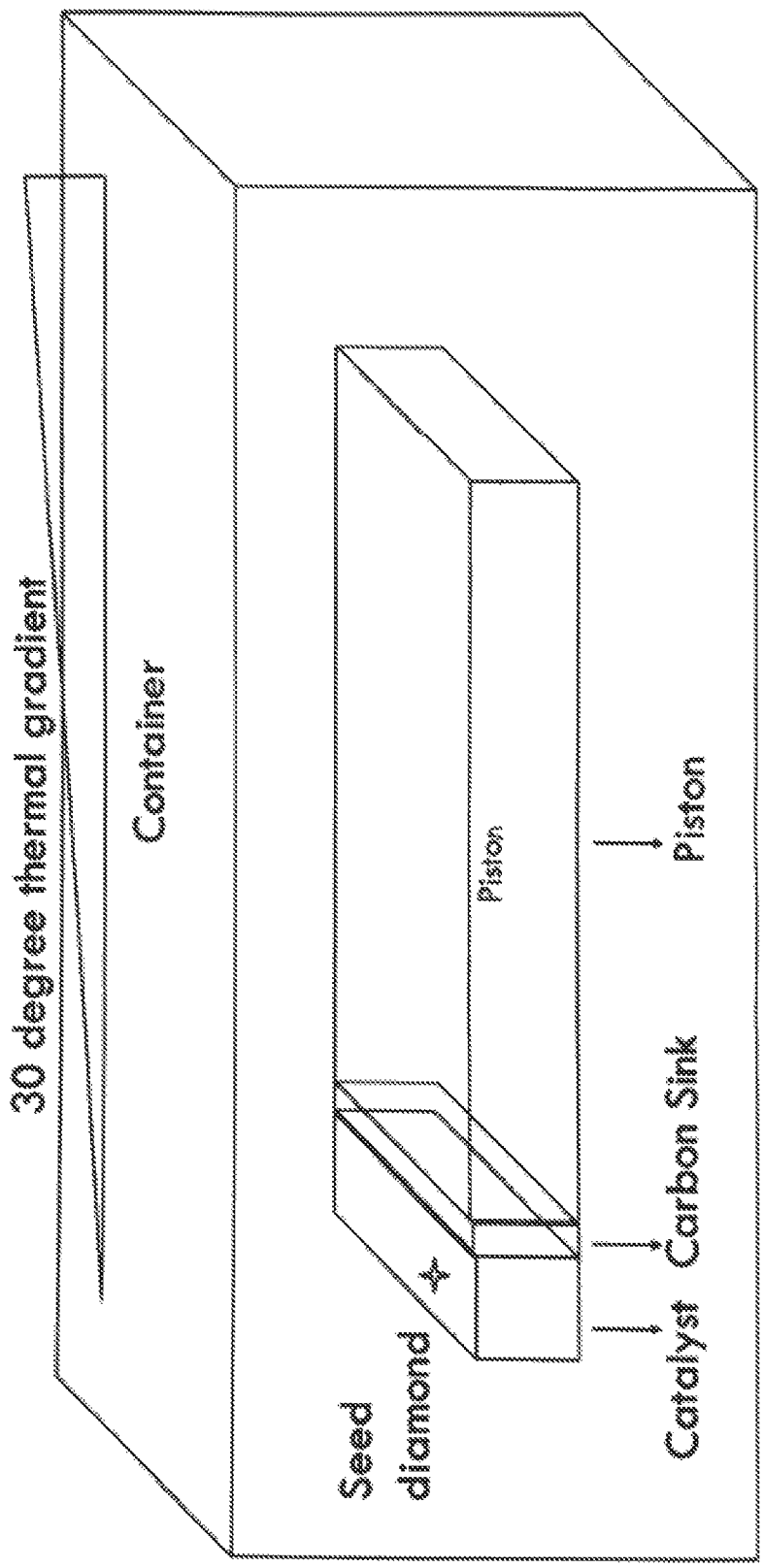
FIG. 5 is a simplified schematic representation of a fourth apparatus of the present disclosure.
Figure 6:
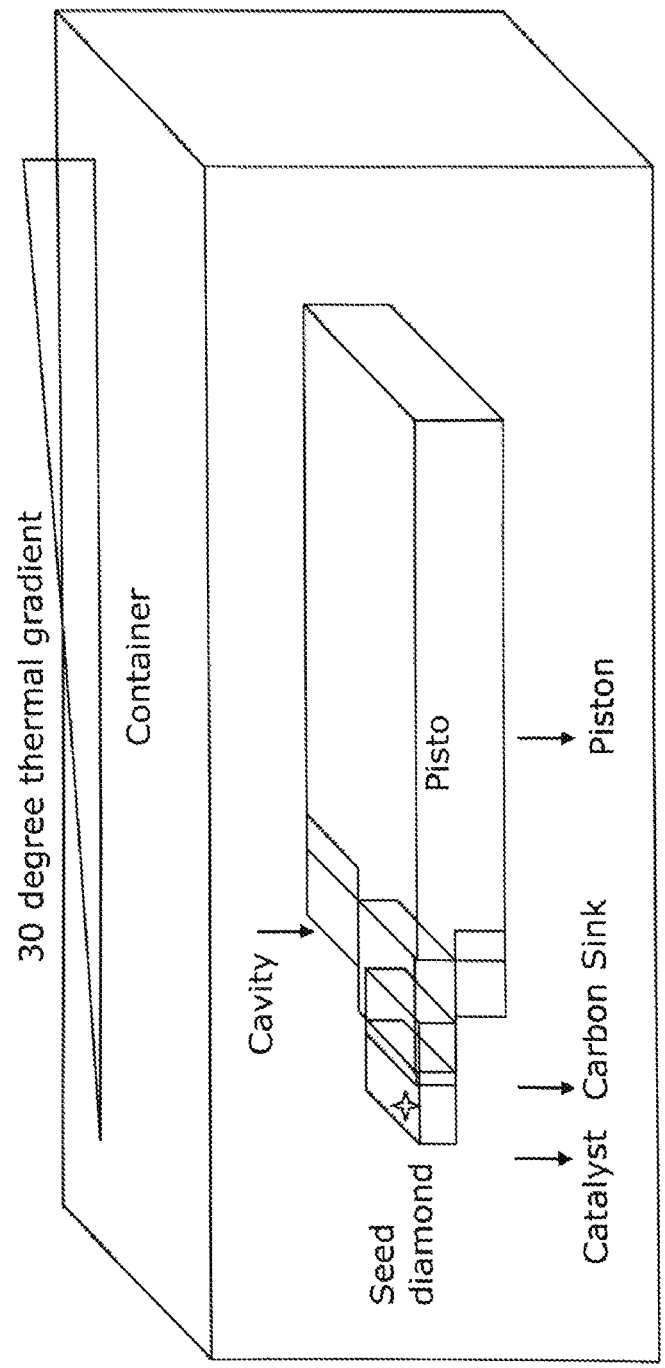
FIG. 6 is a simplified schematic representation of a fifth apparatus of the present disclosure.
Figure 7:
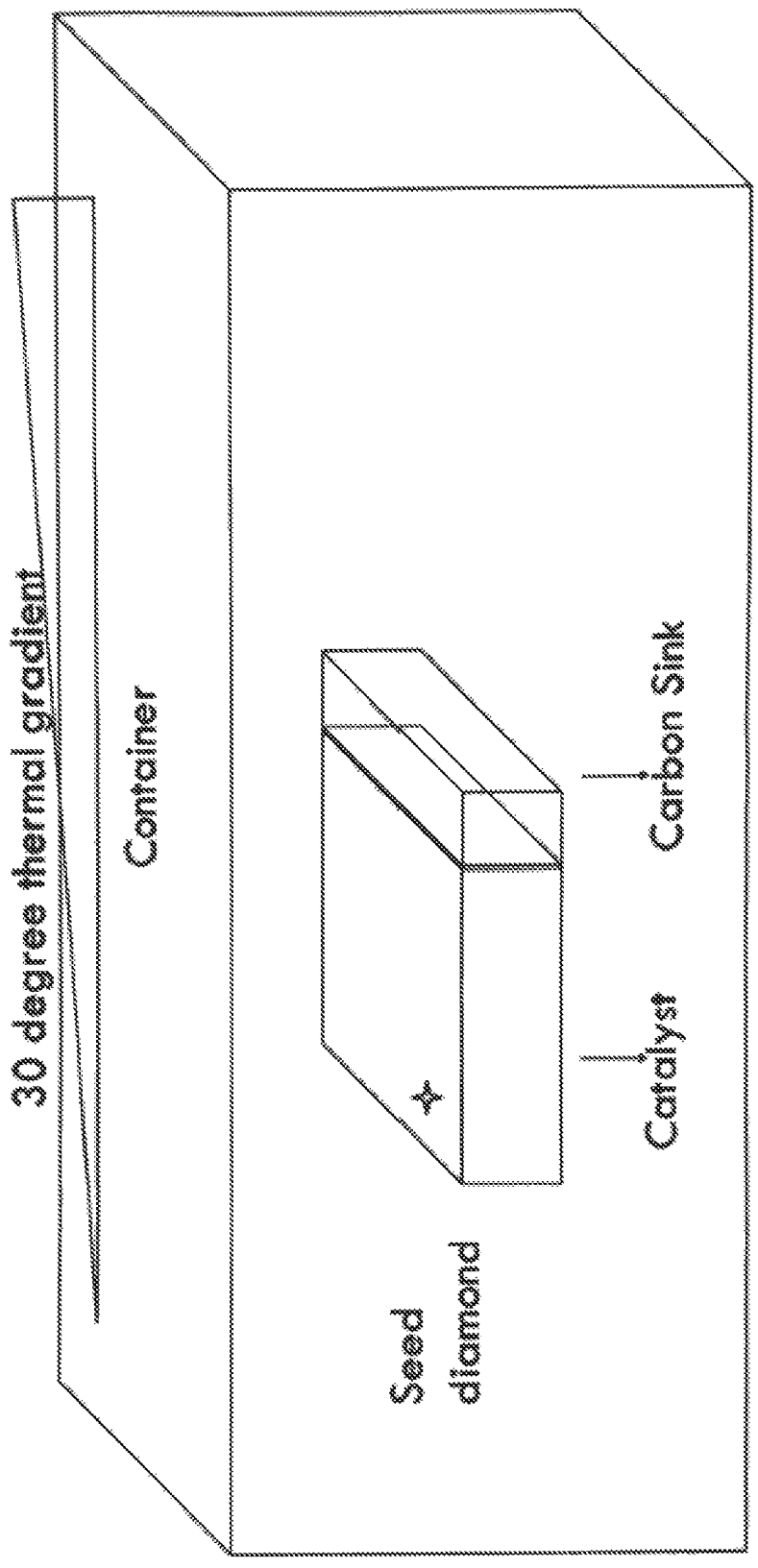
FIG. 7 is a simplified schematic representation of a sixth apparatus of the present disclosure.

FIGS. 5 to 7 illustrate embodiments having apparatus that corresponds to the apparatus shown in FIGS. 1, 3 and 4 respectively. The difference between the embodiments of FIGS. 5 to 7 when compared to the embodiments of FIGS. 1, 3 and 4 lies in the way in which the apparatus is heated and the use of a seed diamond. The seed diamond is placed at the end of the catalyst furthest away from the carbon source. The embodiments shown in FIGS. 5 to 7 are subject to a temperature gradient. The end of the cylinder were the seed diamond is located is 30 C cooler than the other end of the apparatus.

The characteristics needed for the material from which the container 2 is made are: stiffness (a stiff material is required); strength (a strong material is required); and a very high melting point.

The characteristics needed for the material from which the piston 4 is made are: a large difference in thermal expansion rate compared to the encapsulation material (the piston needs to expand more than the cylinder for a given temperature change); strength (a strong material is required); and a high melting point.

Candidate materials for both the container 2 and piston 4 may be selected from the materials listed in Table 1 below:

| Material | Melting Point C. | Coefficient of Thermal Expansion $K^{-1}$ @ 20 C. |
| --- | --- | --- |
| W | 3400 | $4.5 \times 10^{-6}$ |
| Nb | 2469 | $7.3 \times 10^{-6}$ |
| Mo | 2620 | $5.2 \times 10^{-6}$ |
| Ta | 2980 | $6.5 \times 10^{-6}$ |
| V | 1910 | $8.4 \times 10^{-6}$ |
| Ru | 2482 | $6.4 \times 10^{-6}$ |
| $MoSi_2$ | 2030 | $7.42 \times 10^{-6}$ |
| Rh | 1964 | $8.2 \times 10^{-6}$ |
| Fe | 1200 | $12 \times 10^{-6}$ |
| TZM | 2623 | $5.3 \times 10^{-6}$ |

One suitable combination of materials would be W for the container and Rh for the piston. As can be understood from the table, the piston will expand significantly more than the container for the same temperature rise.

Figure 8:
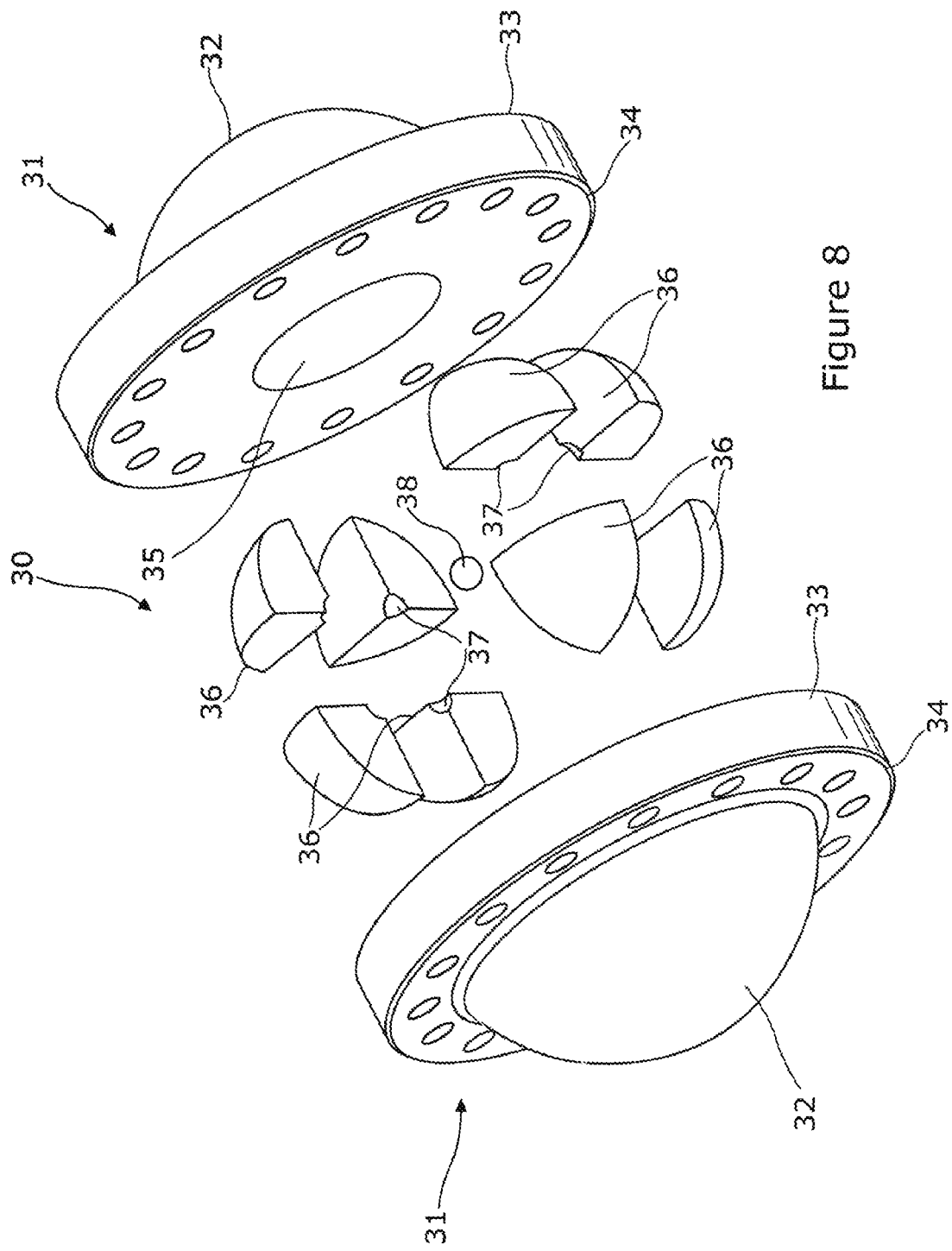
FIG. 8 is a schematic representation of a seventh apparatus of the present disclosure.

FIG. 8 illustrates an alternative embodiment of the present disclosure. The apparatus 30 comprises two outer housings 31 each of which comprises a hemispheric shell 32 and a flange 33, the flanges comprising a series of holes for receiving fasteners to secure the two outer housings together. The hemispherical shells 32 each include a hemispherical recess 35, which together form a spherical chamber when the two outer housings 31 are fastened together. A set of eight inserts 36 form a sphere when brought together. The sphere fits inside the spherical chamber of the housings 31. Each of the inserts 36 includes a recess 37. When these inserts are brought together a central spherical chamber is formed in which the piston, catalyst, carbon source and seed diamond are placed. Of course, as in the apparatus illustrated in FIGS. 1 to 7 it is not essential to have a seed diamond, nor is a piston essential.

The hemispherical shells 32 are formed from a metal such as tungsten or a cermet such as 3% tantalum carbide-doped tungsten carbide. Doping with tantalum carbide gives the material high tensile strength at high temperatures. Other materials could be used for these components such as Boron carbide, or high strength carbon-fiber reinforced carbon composites, often referred to as carbon-carbon composites.

The inserts 36 are formed of a cermet, which must have sufficient compressive strength to withstand forces at least of 4.4 GPa (typically 5 GPa or greater). One suitable material is a 3% Co doped tungsten carbide. Another suitable material is diamond itself.

The core 38 includes at least the catalyst and carbon source in the form of graphite. The core may also include a piston and where desired seed diamonds. The piston or the catalyst, which may serve the function of the piston in that the material of the catalyst may expand upon heating sufficiently to generate the required pressure for diamond formation, may be formed from one of the materials listed in Table 1.

Figure 9:
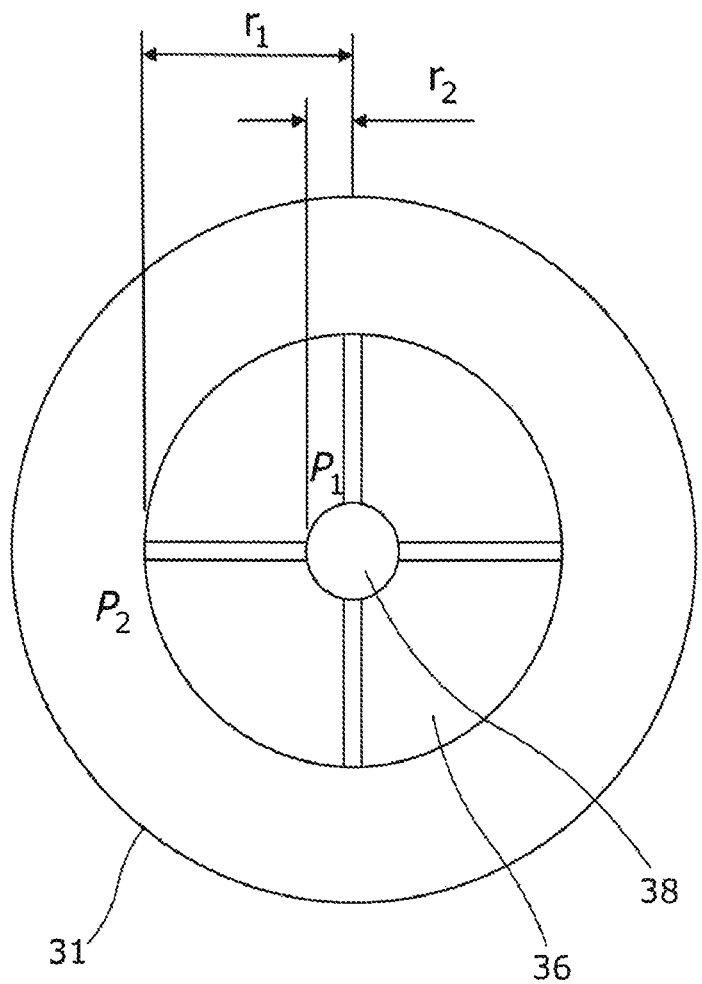
FIG. 9 is a cross-section through the apparatus illustrated in FIG. 8.
Figure 13C:
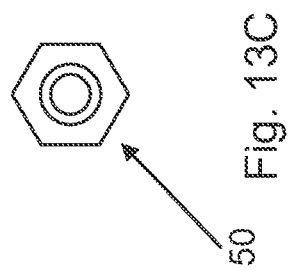
FIG. 13C is an end view of the fastener illustrated in FIG. 13A.
Figure 13A:
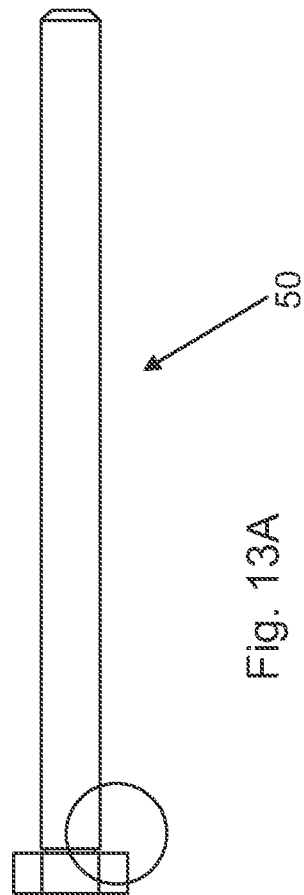
FIG. 13A is a side view of a fastener of the eighth apparatus of the present disclosure.
Figure 13B:
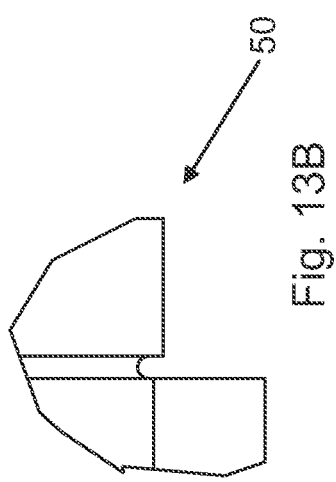
FIG. 13B is an exploded view of the encircled part of the fastener shown in FIG. 13A.

FIG. 10 (including FIGS. 10A-10D), FIG. 11 (including FIGS. 11A-11C), FIGS. 12A-12D, and FIGS. 13A-13C collectively illustrate a variant of the embodiment illustrated in FIGS. 8 and 9. The apparatus comprises outer housings 31', each including a hemispherical shell 32' surrounded by a flange 33'.

An anvil cell is provided by six inserts 36'. Each insert 36' has an end face 37'. When the six inserts are assembled within the housings 31' a central cube shaped chamber is formed. A cube shaped core including the carbon source, catalyst, piston and seed diamonds (if seed diamonds are required) are placed in the cube shaped chamber.

The housings 31' are held together by a clamping ring formed by clamp ring halves 40 and bolts 50. Each clamp ring half includes a recess 41 that is shaped and dimensioned to receive the flange 33'. The clamp ring halves are held together by bolts 50 passing through aligned holes 43. The flange 33' has an angled face 39. The face 39 lies at an angle of 5 degrees to the horizontal in FIG. 10. The clamp ring halves have a correspondingly angled face 44. These angled faces ensure that as the clamp ring is tightened the housings 31' are pressed together.

The housings 31' and inserts 36' are formed of the same materials as discussed above in relation to FIGS. 8 and 9.

Figure 14A:
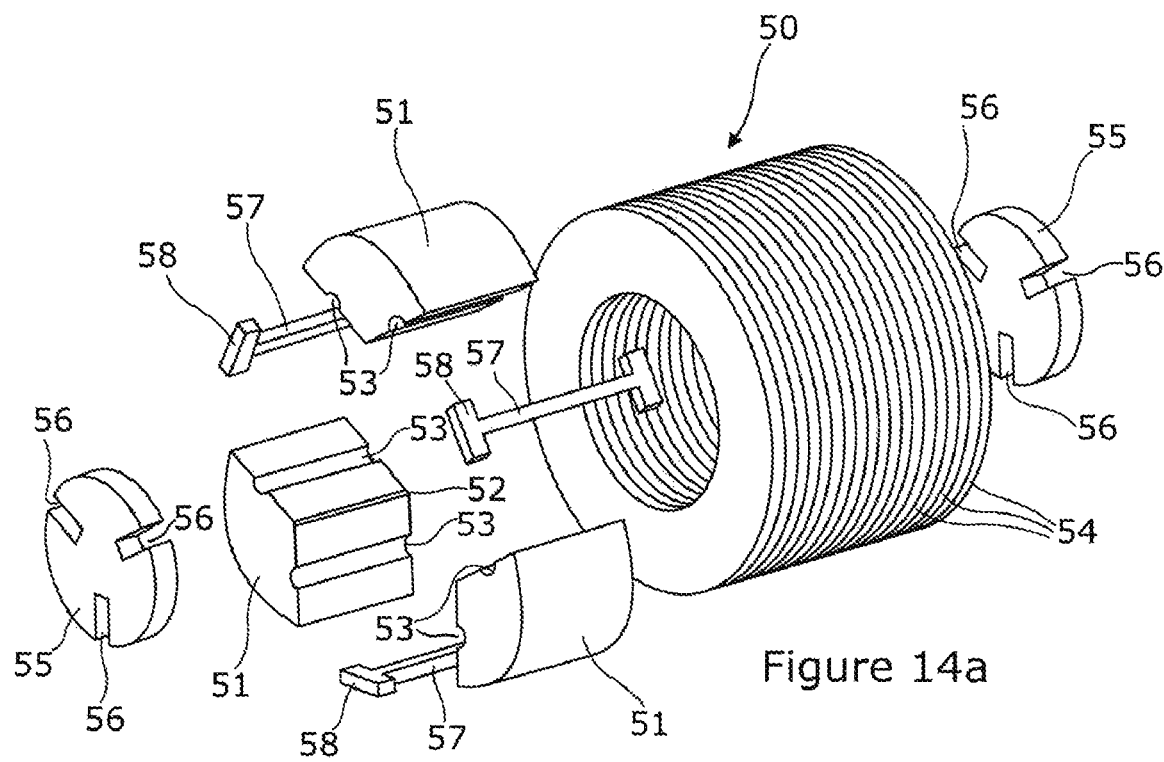
FIG. 14a is a schematic representation of a ninth apparatus of the present disclosure.
Figure 14B:
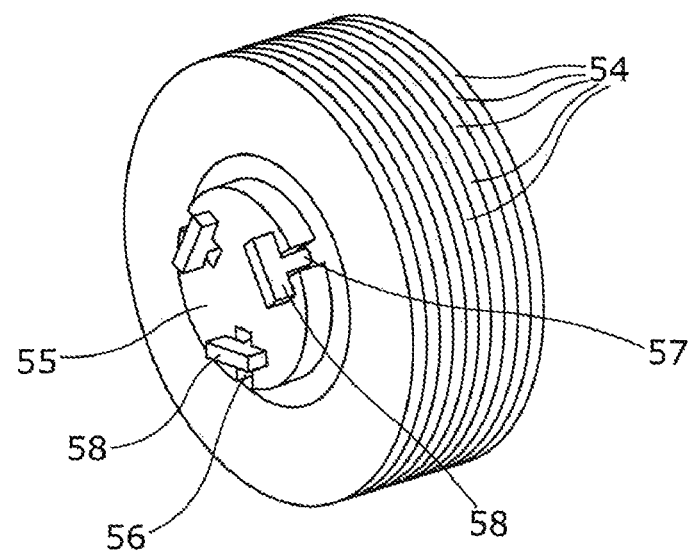
FIG. 14b is a schematic representation of the apparatus illustrated in FIG. 14a in assembled form.

FIGS. 14a and 14b illustrate a working embodiment of the concept apparatus illustrated in FIGS. 1 to 7. The apparatus 50 provides a container 2 with three co-operating segments 51 which are enclosed within a series of hoops 54 and end caps 55. These cooperating segments generate a multi-dimensional pressure as differential thermal expansion causes them to constrict the central chamber. The apex of each of the segments 51 is removed to form a concave recess 52. When the three segments 51 are brought together, as shown in FIG. 14b, the recesses 52 form a cylinder extending between the end caps 55. The cylinder may have a diameter of between 0.5 mm and 2.0 mm, although diameters below 0.5 mm and above 2.0 mm may also function. The segments 51 also include slots 53. The slots 53 of adjacent segments 51 align when the segments 51 are assembled to form holes through which locking bars 57 extend. The end caps 55 include slots 56 which are aligned with corresponding holes formed by slots 53. The locking bars 57 have lock elements 58 at each end thereof. When the segments 51, hoops 54, end caps 55 are assembled the lock elements 58 may be positioned to lock all the components together, as shown in FIG. 14b, or to permit the disassembly of the components. The components of the apparatus 50 may be disassembled by first turning the lock elements 58, and hence the locking bars 57 through 90 degrees from the position shown in FIG. 14b. The locking elements are then aligned with the slots 56 of the end caps 55 which may be removed.

The cylinder formed by recesses 52 is filled with the carbon source, seed diamonds if seed diamonds are to be used, a catalyst and a piston, if the catalyst is not to function as component that expands when heated to generate the desired pressure.

The components of the whole apparatus are secured tightly together by the action of heat and the differential expansion of the materials from which the components of the apparatus are manufactured. In particular, the locking bars 57 and locking elements 58 are formed from carbon-carbon. This material expands significantly less than the metals or cermets from which the other components of the apparatus are manufactured. Hence, as the whole apparatus heats up, the components 51, 54, 55 expand much more than the locking bars 57 and locking elements 58 causing all the components to be pressed tightly together. As the apparatus 50 is heated the piston and or catalyst within the cylinder formed by recesses 52 expand more than the segments 53, causing the pressure within the cylinder to rise to the required level.

Figure 19:
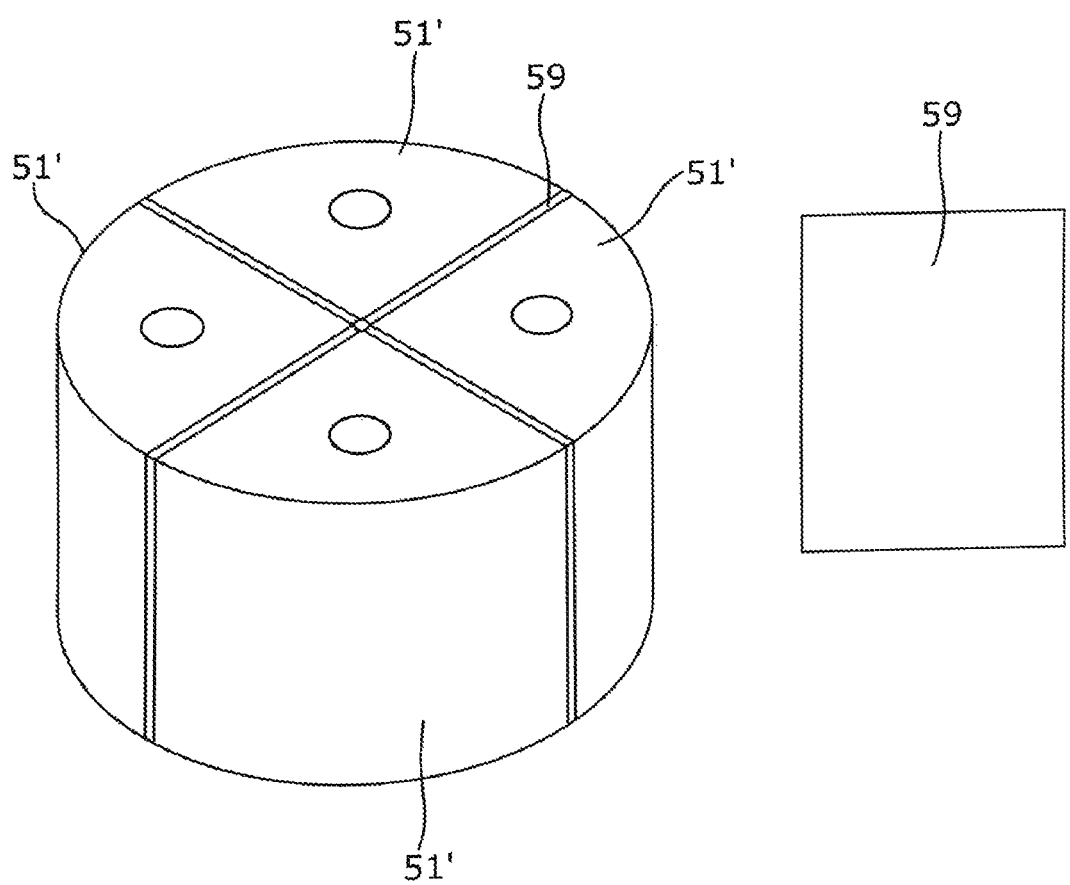
FIGS. 19 and 20 are schematic representations of an alternative embodiment of the present disclosure.
Figure 20:
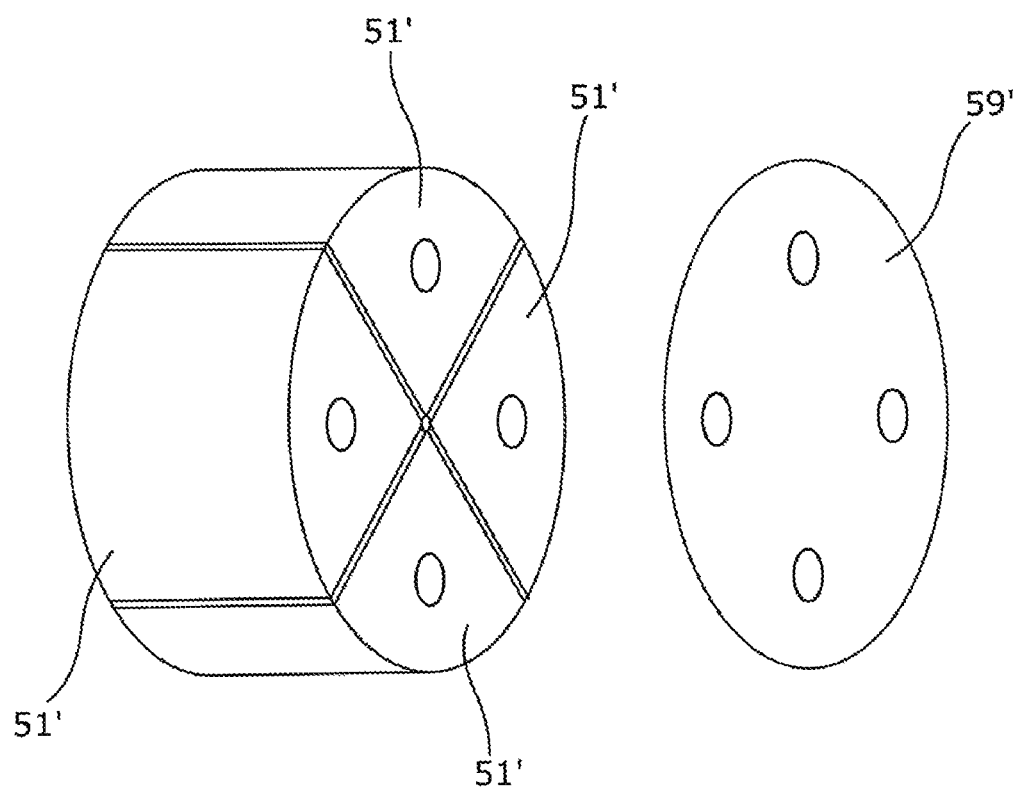

Referring also to FIGS. 19 and 20, which illustrate co-operating segments 51' similar to the co-operating segments 51 illustrated in FIGS. 14a and 14b, the co-operating segments 51' may be used in place of the segments 51 with the other components described with reference to FIGS. 14a and 14b. Adjacent segments 51' have gaskets 59 inserted therebetween. Further gaskets 59' are provided for the end faces of the assembled segments 51', the gaskets 59' sitting between the end caps 55 and the said end faces of the assembled segments 51'. Typically, the gaskets 59, 59; are formed of carbon, such as carbon sheets, carbon-carbon sheets, soapstone, pyrophyllite, or other materials capable of withstanding the temperatures experienced by the apparatus and capable of functioning as a gasket. Gaskets may also be provided between adjacent hoops 54.

FIG. 15 illustrates the apparatus 1 (which could equally be the apparatus illustrated in FIGS. 8 to 14b) mounted in a furnace 60. The furnace 60 is provided with a controller 61 and a thermocouple 62, which monitors the temperature within the furnace. The controller 61 uses the signal from the thermocouple to adjust the furnace so as to maintain the furnace temperature at or close to a desired set temperature.

The apparatus and method of the present disclosure allow synthetic diamonds to be formed by harnessing expansion of one material relative to another upon heating in order to generate the pressures required for synthetic diamond formation. This will allow much smaller apparatus to be manufactured. For example, the apparatus illustrated in FIGS. 8 to 14 may weigh 20 Kg or less.

The apparatus of the present disclosure provides a much simplified means of applying pressure to a source of carbon in order to produce synthetic diamonds. The need for external pressure application devices is eliminated. All that needs to be controlled is temperatures, and the heating means provides for this to be done accurately.

The invention claimed is:

1. An apparatus for the manufacture of synthetic diamonds comprising:
a pressure vessel having a chamber therein; and
a body located in the chamber,
wherein the pressure vessel and the body are formed of materials having different coefficients of expansion, the coefficient of expansion of the body being greater than the coefficient of expansion of the pressure vessel;
wherein the chamber is configured to receive the body, and a carbon source;
wherein the pressure vessel is formed from a material having a melting point in excess of 1327° C. and capable of reacting and withstanding forces generated by a pressure of at least 4.4 GPa located at the source of carbon in the apparatus, said pressure generated by differential thermal expansion of the body within the chamber when the pressure vessel is at temperatures in excess of 1327° C.;
wherein the pressure vessel includes at least one housing member configured to resist said forces generated by differential thermal expansion of the body upon heating thereof;
wherein the at least one housing member is formed from a material selected from the group consisting of: W; tungsten carbide; doped tungsten carbides; 3% Co doped tungsten carbide; boron carbide; carbon reinforced composites; carbon-fiber reinforced composites, carbon-fiber reinforced carbon composites, carbon reinforced graphite, carbon fiber reinforced graphite, and carbon-carbon;
wherein the apparatus further comprises a furnace and the pressure vessel is situated in the furnace, said furnace configured to heat the pressure vessel, the body, and the carbon source to a temperature of at least 1327° C.; and
wherein the coefficient of expansion of the body and the pressure vessel are is selected such that upon heating thereof by said furnace to at least 1327° C. the pressure exerted on the carbon source is at least 4.4 GPa.

2. The apparatus according to claim 1, wherein:
the body has at least two body surfaces, expansion of at least one of the body surfaces is constrained by engagement of the at least one of the body surfaces with a surface of the chamber, another of the body surfaces is not engaged with a surface of the chamber, and the carbon source is situated between a surface of the chamber and the another of the body surfaces that is not engaged by the surface of the chamber; or
the body has at least one body surface, and the carbon source is situated around the body between the at least one body surface and the surface of the chamber.

3. The apparatus according to claim 1, wherein the body includes a piston.

4. The apparatus according to claim 3, wherein the chamber is in the form of a cylinder and the piston is arranged in the cylinder.

5. The apparatus according to claim 1, comprising a catalyst located in the chamber.

6. The apparatus according to claim 5, wherein the catalyst is comprised in the body.

7. The apparatus according to claim 1, wherein the carbon source is a part of the body.

8. The apparatus according to claim 1, wherein:
the pressure vessel includes a plurality of inserts each of which forms at least one surface of the chamber, and at least two housing members and fastening elements which fasten together the housing members;

the inserts sit inside the housing members; and the inserts, the housing members and the fastening elements resist pressure generated by expansion of the body upon heating thereof.

9. The apparatus according to claim 8, wherein the inserts together form a sphere and the housing members each comprise a hemispherical shell shaped and dimensioned to receive the assembled inserts.

10. The apparatus according to claim 9, wherein the chamber is spherical or comprises a volume enclosed by a plurality of planar or curved surfaces.

11. The apparatus according to claim 8, wherein the housing members each include a flange, and the flanges are aligned and fastened together with fastening means.

12. The apparatus according to claim 11, wherein:

the fastening means comprises bolts which pass through aligned holes in the flanges; or the fastening means comprises a clamping ring including two clamping ring elements which are attached together and surround the flanges.

13. The apparatus according to claim 11, wherein:

the fastening means comprises a clamping ring including two clamping ring elements which are attached together and surround the flanges; and the clamping ring elements each include a recess and wherein the flanges sit in the recesses.

14. The apparatus according to claim 1, wherein the material from which the body is formed includes at least one material selected from the group consisting of: W, Nb, Mo, Ta, V, Ru, $MoSi_2$, Rh, and TZM.

15. The apparatus according to claim 1, wherein the material from which the chamber is formed includes at least one material selected from the group consisting of W, Nb, Mo, Ta, Ru, $MoSi_2$, Rh, a cermet, 3% Co doped tungsten carbide, Boron Carbide, Hafnium Carbide, Boron Nitride and diamond.

16. The apparatus according to claim 12, wherein a material from which the fastening means are formed includes at least one material selected from the group consisting of: W, Ta, Nb, carbon reinforced composites, carbon fiber reinforced composites, carbon fiber reinforced carbon composites, carbon reinforced graphite, carbon fiber reinforced graphite and carbon-carbon.

17. The apparatus according to claim 1, further comprising at least one gasket, each of the at least one gasket being situated between adjacent components of the apparatus.

18. The apparatus according to claim 8, further comprising at least one gasket, at least one of the at least one gasket being situated between adjacent inserts.

19. The apparatus according to claim 11, further comprising at least one gasket, at least one of the at least one gasket being situated between adjacent flanges.

20. The apparatus according to claim 17, wherein a material from which the at least one gasket is formed includes at least one material selected from the group consisting of: carbon, carbon reinforced composites, carbon fiber reinforced composites, carbon-carbon (including carbon reinforced carbon, carbon reinforced graphite, carbon fiber reinforced graphite, or carbon fiber reinforced carbon), soapstone, pyrophyllite, other materials capable of withstanding the temperatures experienced by the apparatus and functioning as a gasket, and any of the aforementioned in sheet form.

21. The apparatus according to claim 1, comprising at least one seed diamond in the chamber.

22. The apparatus according to claim 21, wherein the at least one seed diamond is comprised in the body.

23. The apparatus according to claim 1, wherein the furnace is adapted to create a temperature gradient across the chamber rising from one side of the chamber to the other.

24. The apparatus according to claim 5, wherein:

the heating means is adapted to create a temperature gradient across the chamber rising from one side of the chamber to the other; and the temperature gradient rises from the surface of the chamber farthest from the body where the catalyst is situated to the surface of the body.

25. The apparatus according to claim 1, wherein the furnace is capable of heating the pressure vessel, the body and the carbon source to a temperature in the range of 1327° C. to 4000° C.

26. An apparatus according to claim 25, wherein the furnace is provided with a temperature sensor and a controller, the temperature sensor providing a furnace temperature feedback to the controller.

27. A method of manufacturing synthetic diamonds, comprising the steps of:

providing an apparatus according to claim 1;

raising a temperature of the pressure vessel to a selected temperature within the range of 1327° C. and 4000° C. for a period of between 20 minutes and 1 week, and controlling the temperature during the period; and generating a pressure of at least 4.4 GPa within the chamber for the period.

\* \* \* \* \*